United States Patent [19]

Yang

[11] Patent Number: 4,677,392
[45] Date of Patent: Jun. 30, 1987

[54] CASCADED INTERNAL IMPEDANCE DEPENDENT AMPLIFIER WITH ACCURATE VARIABLE GAIN CONTROL

[75] Inventor: Steve S. Yang, Chatsworth, Calif.

[73] Assignee: Hughes Aircraft Company, Los Angeles, Calif.

[21] Appl. No.: 809,628

[22] Filed: Dec. 16, 1985

[51] Int. Cl.$^4$ ............................................. H03G 3/30
[52] U.S. Cl. ................................. 330/284; 330/289; 330/311
[58] Field of Search ............... 330/86, 145, 282, 283, 330/284, 289, 311

[56] References Cited

U.S. PATENT DOCUMENTS

| 3,942,181 | 3/1976 | Berrod et al. | 330/283 X |
| 4,464,635 | 8/1984 | Rypkema | 330/284 |
| 4,524,331 | 6/1985 | Faith | 330/311 X |

FOREIGN PATENT DOCUMENTS 3408  1/1982  Japan ................................ 330/283

Primary Examiner—James B. Mullins
Attorney, Agent, or Firm—C. D. Brown; A. W. Karambelas

[57] ABSTRACT

An internal impedance dependent amplifier has a gain as determined by the impedance at a predetermined node within the amplifier. A PIN diode is coupled to the predetermined node. The PIN diode is driven with a forward biased current which serves as the accurate gain control (AGC) signal for the amplifier. In the preferred embodiment, the PIN diode is driven by an operational amplifier in such a manner that the impedance thus coupled to the predetermined node in the amplifier is temperature independent. Because the PIN diode has an impedance given by:

$$\log R = A + B \log I_p,$$

where
R is the impedance of the PIN diode;
IP is the forward biasing current; and
A and B constants which are different for each PIN diode, the AGC voltage applied to the operational amplifier driving the PIN diode is linear with respect to the impedance of the PIN diode and hence is also linear with respect to the voltage gain of the impedance controlled amplifier to which the PIN diode is coupled. This characteristic of the gain of the amplifier allows the amplifier to be cascaded in series and to preserve the same impedance relation as expressed above for the cascaded series of amplifiers as well. Thus, the gain in dB of the cascaded series of amplifiers is log linear with respect to a common AGC voltage applied to each of the amplifiers of the series.

3 Claims, 3 Drawing Figures

CASCADED INTERNAL IMPEDANCE DEPENDENT AMPLIFIER WITH ACCURATE VARIABLE GAIN CONTROL

The United States Government has rights in this invention pursuant to contract FO8635-82-C-0001 issued by the United States Air Force.

BACKGROUND OF THE INVENTION

1. Field of the Invention

The invention relates to the field of analog circuit design and in particular relates to the design of cascaded amplifiers wherein temperature independence and accurate gain control is provided.

2. Description of Related Art

In certain types of applications accurate cain control in portions of the electronic circuitry is essential to the effective or useful functioning of the system. One such class of systems include radar systems, particularly those radar systems which require multiple channels and accurate equal gain control.

In the prior art, gain adjustments in amplifiers in radar systems were made using a delta gain control AGC circuit for multiple channels of the amplifier. However, even where each channel is separately adjusted, the relative gain among channels must not only be initially calibrated or equalized, but such equalization must be maintained over time as well. Therefore the prior practice has been to provide an additional delta gain control AGC circuit to compensate for drifts in gain among the various channels of a multiple channel amplifier. Nevertheless, such prior art designs require periodic checking to match the gain of the multiple channels.

In addition prior art circuits which incorporate some type of gain reduction inherently, by virtue of their design, affect the noise figure of the amplifier, namely the higher the gain reduction the higher the noise figure. Similarly, the gain of such prior art circuits may become non-linear at high gain reduction.

What is needed then is a design for an amplifier which includes an accurate gain control which is of such a design that:

(a) the need for periodic checking, particularly in a multiple channel amplifier is eliminated, and (b) the gain does not lose linearity or suffer a deterioration of its noise figure with higher gain reduction.

SUMMARY OF THE INVENTION

The invention is an internal impedance dependent amplifier circuit which is characterized by an amplification gain according to an impedance at a predetermined node of the amplifier, and which is characterized by an accurate gain control (hereinafter termed "AGC") achieved by accurately controlling the internal impedance of the amplifier. By reason of this combination the gain of the amplifier circuit is selectively determined. The AGC circuit comprises in turn a diode and another subcircuit for applying a forward bias current to the diode to vary its impedance. The AGC circuit provides a log linear impedance with respect to a selective control signal applied thereto. A log linear impedance is defined for the purposes of this specification to mean an impedance such that if the logarithm of the gain of the AGC is linearly varied, the logarithm of the impedance will also vary linearly. In particular, the AGC circuit is a PIN diode and the selective control signal is a forward biased current applied thereto.

Among the advantages of this circuit is the surprising result that the noise figure of the amplifier is affected only to a very minor extent by the magnitude of the AGC control signal. Moreover, the linearity of the amplifier is not only retained at higher gain reduction magnitudes, but actually improves with higher gain reduction magnitudes.

In addition the subcircuit comprises a temperature compensation subcircuit for driving the diode forward biased current independently of thermal parametric variations of the diode. In more general terms, the AGC circuit further comprises a temperature independent subcircuit for driving the AGC circuit independently of thermal parametric variations of the AGC circuit.

The invention further comprises a plurality of impedance controlled amplifiers and corresponding AGC subcircuits. Each impedance controlled amplifier has an input and an output node. The output node of each impedance controlled amplifier is coupled to the input of another one of the plurality of impedance controlled amplifiers to form a cascaded series of the plurality of impedance controlled amplifers. One of the plurality of impedance controlled amplifiers has an input port and the last one of the plurality of impedance controlled amplifiers has an output port to provide an input and output of the cascaded series of impedance controlled amplifiers respectively. The cascaded plurality of amplifiers is also characterized by a log linear gain with respect to the AGC voltage. The log linear relation of gain to AGC control voltage is achieved by providing each corresponding AGC circuit of the plurality of impedance controlled amplifiers with a common AGC control voltage.

The invention further includes a plurality of impedance controlled amplifiers coupled to form a subplurality of cascaded series connected impedance controlled amplifiers. Each one of the subplurality of cascaded series connected impedance controlled amolifiers defines a separate channel having a corresponding separate input and output.

In more specific terms the invention is an amplifier circuit comprising a first active stage, which is a voltage amplifier; a second active stage, which is a current amplifier, having an input coupled to the first stage; and a subcircuit for providing a gain control which couples to the node between two stages. The subcircuit is independently driven with respect to the first and second stages. The subcircuit provides a log linear feedback signal to drive the internal loading impedance of the first stage. In particular the subcircuit comprises a PIN diode selectively driven by a forward biased current to vary the impedance of the PIN diode in the amplifier comprised of the first and second stages. The first stage of the amplifier is a common base transistor and the second stage is an emitter follower transistor. The PIN diode is coupled to the node between the output of the common base transistor and the input of the emitter follower transistor. The subcircuit comprises another or second PIN diode to compensate for temperature drift of the PIN diode, which second PIN diode is selectively driven by a forward biased current to vary the imoedance of the PIN diode in the amplifier.

The invention also includes a method for controlling the gain of an impedance controlled amplifier comprising the steps of coupling a variable resistance to a predetermined node within the impedance controlled ampli fier, the impedance controlled amplifier being characterized by having a gain determined by the impedance at the predetermined node, and the step of varying the variable resistance coupled to the node in a log linear fashion. In the step of varying the variable resistance, the forward biased resistance of a PIN diode coupled to the predetermined node is varied by varying a forward biased current applied to the PIN diode. The method further comprises the step of varying the forward biased current in the PIN diode in a temperature compensated manner.

The method still further comprises the steps of coupling and varying the forward biased current in the PIN diode in a plurality of cascaded impedance controlled amplifiers, each amplifier being controlled by a common voltage.

DESCRIPTION OF THE PREFERRED EMBODIMENTS

Figure 1:
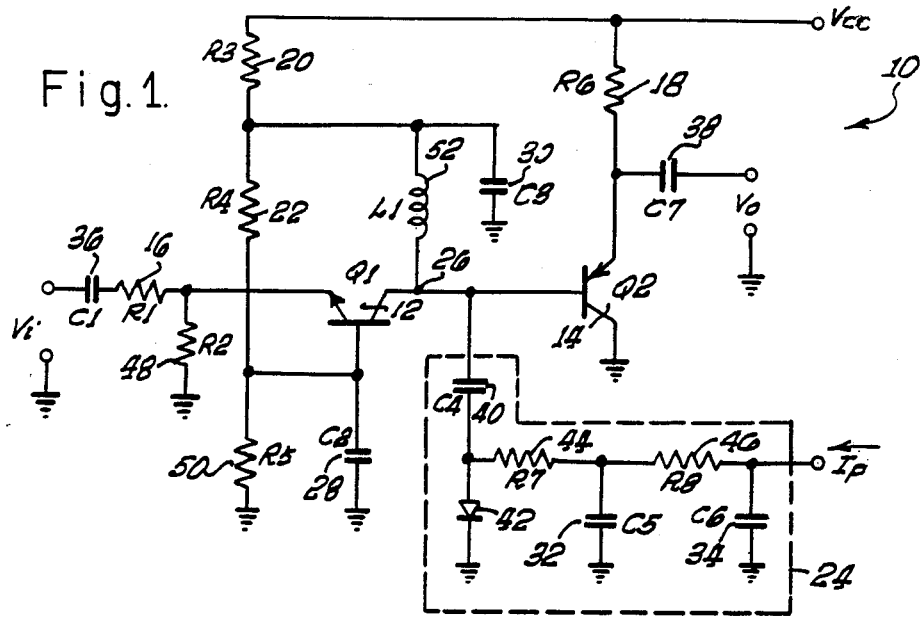
FIG. 1 is a schematic diagram of an intermediate frequency (IF) single stage amplifier incorporating the invention.

An internal impedance dependent amplifier has a gain as determined by the impedance at a predetermined node within the amplifier. A PIN diode is coupled to the predetermined node. The PIN diode is driven with a forward biased current which serves as the accurate gain control (AGC) signal for the amplifier. In the preferred embodiment, the PIN diode is driven by an operational amplifier in such a manner that the impedance thus coupled to the predetermined node in the amplifier is temperature independent. Because the PIN diode has an impedance given by:

$$\log R = A + B \log Ip,$$

where
R is the impedance of the PIN diode;
Ip the forward biasing current; and
A and B constants which are different for each PIN diode, the AGC voltage applied to the operational amplifier driving the PIN diode is log linear with respect to the impedance of the PIN diode and hence also log linear with respect to the voltage gain of the impedance dependent amplifier to which the PIN diode is coupled. This characteristic of the gain of the amplifier allows the amplifier to be cascaded in series and to preserve the same impedance relation as expressed above for the cascaded series of amplifiers as well. Thus, the voltage gain of the cascaded series of amplifiers is also log linear with respect to a common AGC voltage applied to each of the amplifiers of the series.

As will be made apparent in the following description, the noise figure of the amplifier or a cascade of such amplifiers is substantially independent of the AGC voltage because gain is determined by the PIN diode's impedance, whose contribution to noise figure is relatively independent of the magnitude of the impedance or at worst a very slowly varying function of its impedance.

The invention is an amplifier which is temperature independent and gain tracking by using the radio frequency (RF) characteristics of a PIN diode. It is known that the logarithm of the RF resistance of a PIN diode is logarithmically linear with respect to its forward current. The amplifier of the present invention thus has its gain resistively controlled. By using a log linear PIN diode as the gain determining resistive element, amplifier gain can then be made log linear relative to the gain control voltage. As a result, an amplifier with a high dynamic range, low intermodulation distortion and gain control with output noise reduced proportional to the gain reduction is realized. For example, using a typical PIN diode in a cascaded amplifier, gain control accuracy of better than 0.5 dB over a range of 60 dB with temperature chances of more than 25 degrees C. in the temperature range of −55 degrees C. to 85 degrees C. is achieved.

The function of the amplifier gain can be verified by taking input and output readings at only two points. This results in considerable ease in gain calibration.

Because of the ease in gain calibration, the design of the amplifier readily allows for adjustments to be made taking into account the individual constants of the operative gain determining element, i.e. the PIN diode.

As will be ascertainable below, the center frequency of the amplifier is set by a single inductive element, which permits a hybrid circuit design of small size and easily adjustable performance. This makes the design a universal circuit block usable in a wide variety of applications with no redesign required.

Of particular advantage is the fact that as the gain control voltage changes in the circuit, the phase of the center frequency does not change. This is clearly an advantageous attribute where, as in radar circuits, the phase of a received signal carries significant information. In the prior art, compensation of some sort was required to accommodate phase changes in the center frequency of the tuned amplifiers as gain changed. This is unnecessary in the circuit of the invention.

As will further be described below, as the current in the PIN diode increases (increasing gain reduction) the voltace distortion across the PIN diode decreases. Thus, unlike prior art amplifiers, the linearity of the circuit of the invention actually improves with gain reduction.

Exactly how these advantages are accomplished is better understood by turning to the schematic diagram of FIG. 1.

The amplifier, generally denoted by reference numeral 10 is a resistance dependent amplifier which forms the core of the log linear gain control IF amplifier. Amplifier 10 is comprised of two active devices, complementary transistors 12 and 14, and inout resistor 16. Ignoring frequency dependence impedances in FIG. 1 for the moment, disconnecting subcircuit 24, and substituting a resistor Rc for it, (which assumes that Rc is not more than one tenth of the value of the output impedance of transistor 12 and the input impedance of transistor 14), and concentrating only on the transistor parameters and resistances, it can be shown that the voltage gain of amplifier 10 is approximately equal to:

$$Vo/Vi = Rc/Ri,$$

where

Vo is the output voltage;
Vi is the input voltage;
Rc is the resistance of node 26 which is dominated by PIN diode 42;
Ri is the amplifier input resistance.

Hence the gain of the amplifier is the ratio of its input impedance, Ri, and the impedance of PIN diode, Rc. Many of the advantages of the circuit design discussed above result from the dependence of gain and other circuit parameters on the PIN diode's impedance and the inherent properties of the PIN diode. Therefore, amplifier 10 combines the voltage gain of transistor 12 with the current gain of transistor 14 to provide an overall power gain with fixed input and output impedances.

What needs to be particularly emphasized here is that the gain of amplifier 10 is almost entirely determined by the ratio of a function of the gain control resistor Rc to the input resistance Ri and less affected by any transistor parameters than in prior art amplifiers. Alternatively stated, the gain is determined by the resistance or impedance at node 26.

The log linear gain control is effectuated through a subcircuit, generally denoted by reference numeral 24. As implied in the above discussion of amplifier 10, the gain of the amplifier is determined by the RF impedance at node 26.

Capacitors 28-34 are RF decoupling capacitors used in a conventional sense in amplifier 10 in a manner which shall not be further described here. Similarly, capacitors 36 and 38 are input and output dc blocking capacitors respectively which are also conventionally employed at the input and output of the single stage amplifier 10 shown in FIG. 1. Capacitor 40 is, however, an RF coupling capacitor which is used to couple the RF signal, which is being amplified, to PIN diode 42. It is well known that the RF resistance of the PIN diode is given by the following equation:

$$\log R = A + B \log Ip$$

where
R is the RF resistance of PIN diode 42;
A and B are constants which will be determined by individual diode; and
Ip is the DC forward current of the PIN diode 42.

Therefore, by applying a predetermined voltage, $-Vc$, to diode 42, the RF resistance can be varied. Resistors 44 and 46 are thus current limiting resistors to define the maximum forward current applied by Vc to diode 42. Resistors 18, 20, 22, 48 and 50 are part of the conventional biasing network for transistors 12 and 14 while inductor 52 is chosen to set the center frequency of amplifier 10.

The effective RF resistance at node 26 is thus controlled by varying the forward current through diode 42. PIN diodes are characterized in general by having an almost pure resistance at RF frequencies, whose value can be varied from approximately 10 kohm to less than one ohm by the control current, Ip. Although all diodes show this behavior to some extent, the PIN diode is optimized to show this characteristic over a wide resistance range, with good linearity, low distortion and low control current drive.

Figure 2:
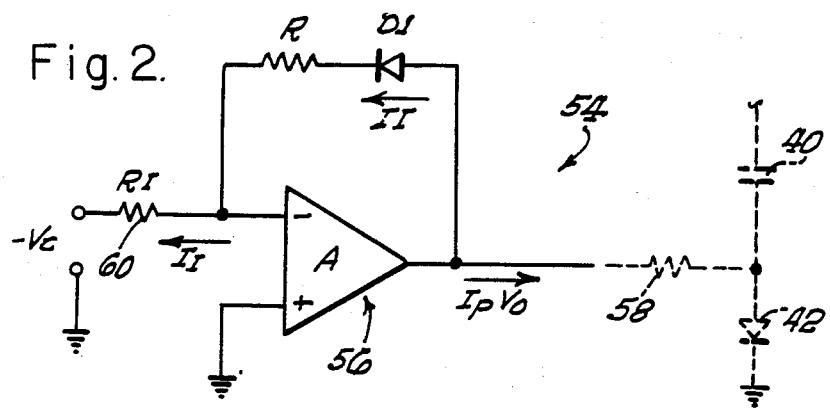
FIG. 2 is a schematic diagram of a temperature compensation subcircuit used in combination with portions of the circuitry of FIG. 1.

Turn briefly to the schematic diagram of FIG. 2. The PIN diode junction voltage changes as a function of temperature. Therefore, it is difficult to control the gain control current, Ip, accurately if the control voltage is directly applied to the PIN diode as the temperature of diode 42 changes. To effect such control, a subcircuit, generally denoted by reference numeral 54 in FIG. 2, is substituted into amplifier 10 of FIG. 1 in place of subcircuit 24.

The gain control voltage, Vc, is coupled to the input of an operational amplifier, generally denoted by reference numeral 56. The output of amplifier 56 is a voltage, Vo and a gain control current, Ip. A resistor 58 serves as a current limiting resistor for diode 42. As before diode 42 is coupled to node 26 of amplifier 10 by coupling capacitor 40. The remaining portion of amplifier 10 has been omitted from the simplified schematic of FIG. 2 for the purposes of clarity of illustration. It follows immediately that:

$$Ip = -Vc/Ri$$

where
Ip is the gain control current at the output of amplifier 56;
Vc is the input gain control voltage at the input of amplifier 56; and
Ri is the input resistance of resistor 60.

It is important to note that Ip is independent of the DC junction voltage of diode 42. Therefore, when used in the circuit of FIG. 2, the forward current through diode 42 will be automatically adjusted to be independent of the diode's DC junction voltage and therefore temperature independent. If Ip is thus temperature independent, then in the equation for the diode RF resistance given above, R will also be temperature independent.

Therefore, what has thus far been described is a single stage, log linear gain controlled, and temperature independent amplifier. In other words, a temperature independent, accurate gain control is provided in amplifier 10 as long as an AGC log linear voltage, Vc, is provided to the input of subcircuit 54 of FIG. 2.

Figure 3:
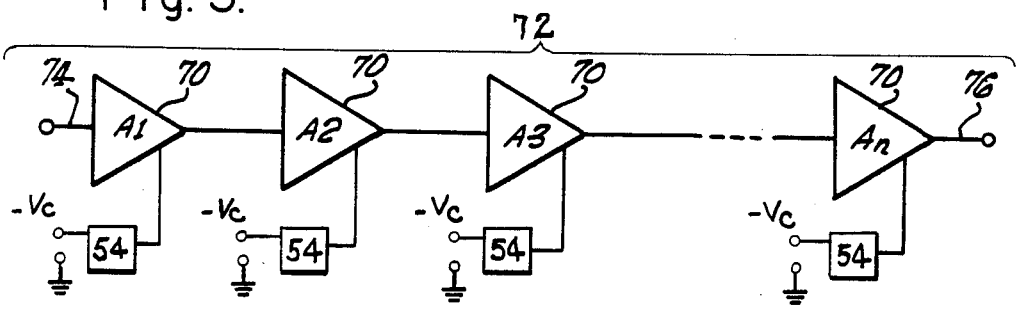
FIG. 3 is a block diagram of a plurality of amplifiers as described in connection with FIGS. 1 and 2 shown as serially cascaded.

The invention is thus summarized as an amplifier incorporating a PIN diode whose resistance is used to control the gain of each stage. The PIN diode is used in a temperature compensation circuit so that the RF resistance of the diode is temperature independent. Multiple stages of the basic amplifier block are cascaded to achieve higher gains and AGC ranges. FIG. 3 is a block schematic of a plurality of amplifiers 70 such as described above with each amplifier coupled in series to comprise a cascade of n amplifiers, A1, A2, A3, ... An. Each amplifier 70, Ai, is provided with a common PIN diode current, Ip, as the AGC signal. Thus, the cascade of amplifiers can be treated as a single amplifier, generally denoted by reference numeral 72, with an input 74, output 76 and AGC control signal, Ip. The log linear characteristic of the PIN diode is used so that the overall gain of the cascaded stages in dB can be expressed as:

$$\text{Gain in } dB = a + b \ln(-V)$$

where
V is the channel's AGC voltage commonly applied to each stage; and
a and b are constants which can be determined by calculations based upon the measured output the voltage of each channel at predetermined AGC voltages.

Many modifications and alterations may be made by those having ordinary skill in the art without departing from the spirit and scope of the invention. Therefore, the illustrated embodiment must be read only as an example which has been set forth for the purposes of clarity and not as a limitation of the invention as defined in the following claims.

What is claimed is:

1. An amplifier circuit comprising:
   a first active stage comprising a common base transistor having an output;
   a second active stage comprising an emitter follower transistor having an input coupled to the output of said first active stage;
   a PIN diode which is independently driven with respect to the first active and second active stages by a forward biased current to vary the impedance of said PIN diode and thereby provide a log linear signal to said first active stage; and
   one terminal of said PIN diode being coupled to the output of said first active stage and to the input of said second active stage and the other terminal of said PIN diode being coupled to ground.

2. The amplifier of claim 1 further comprising circuit means for providing said forward biased current and for adjusting said current to be independent of temperature variations in said amplifier circuit.

3. The amplifier of claim 2 wherein said circuit means comprises:
   an operational amplifier having an output and a control voltage coupled to its input through an input resistor; and
   a series connected resistor and diode one terminal of which is coupled to the output of the operational amplifier, the other terminal of which is coupled to the input of said operational amplifier.

* * * * *